US006821919B2

(12) United States Patent
Hon et al.

(10) Patent No.: US 6,821,919 B2
(45) Date of Patent: Nov. 23, 2004

(54) SUPERIOR TOUGHNESS AND ADHESIVE STRENGTH CERAMIC COATING OF TITANIUM ALUMINUM CARBON NITRIDE-AMORPHOUS CARBON NANOCOMPOSITE

(75) Inventors: Ming-Hsiung Hon, Tainan (TW); Jiann Shieh, San Chung (TW)

(73) Assignee: National Cheng Kung University (TW)

( * ) Notice: Subject to any disclaimer, the term of this patent is extended or adjusted under 35 U.S.C. 154(b) by 0 days.

(21) Appl. No.: 10/304,966

(22) Filed: Nov. 27, 2002

(65) Prior Publication Data

US 2003/0143402 A1 Jul. 31, 2003

(30) Foreign Application Priority Data

Nov. 29, 2001 (TW) ........................................ 90129594 A

(51) Int. Cl.[7] .............................................. C04B 35/00
(52) U.S. Cl. ................ 501/96.1; 106/286.1; 106/286.2; 106/286.4; 106/286.5; 106/286.8; 252/502; 252/506; 252/507; 501/98.4; 501/99
(58) Field of Search ........................... 106/286.1, 286.2, 106/286.4, 286.5, 286.8; 252/502, 506, 507; 501/96.1, 98.4, 99; 428/408, 698

(56) References Cited

U.S. PATENT DOCUMENTS 5,102,646 A * 4/1992 Bienvenu ..................... 501/88
5,114,695 A * 5/1992 Jain et al. ................... 501/98.4
5,756,410 A * 5/1998 Dunmead et al. ........... 501/96.1
5,876,659 A * 3/1999 Yasutomi et al. ............ 264/638
6,143,448 A * 11/2000 Fauteux et al. ........... 429/231.8
6,497,772 B1 * 12/2002 Meckel et al. .............. 148/273

FOREIGN PATENT DOCUMENTS

JP    2001115958    *  4/2001
JP    2002003284    *  1/2002

* cited by examiner

Primary Examiner—Archene Turner

(57) ABSTRACT

A nanocomposite having titanium aluminum carbon nitride and amorphous carbon is disclosed, and the nanocomposite comprises a titanium aluminum carbon nitride grain of nanometer scale and an amorphous carbon matrix, wherein the titanium aluminum carbon nitride grain of nanometer scale is embedded into the amorphous carbon matrix. The method for coating the nanocomposite of titanium aluminum carbon nitride-amorphous carbon on a substrate comprises: depositing the substrate in a reaction chamber; and igniting plasma to clean and remove an oxide layer and adsorptive on the substrate; injecting a reaction gas. The reaction gas is activated and thermal decomposed by plasma to form the nanocomposite coating layer of titanium aluminum carbon nitride-amorphous carbon on the surface of the substrate.

3 Claims, 6 Drawing Sheets

SUPERIOR TOUGHNESS AND ADHESIVE STRENGTH CERAMIC COATING OF TITANIUM ALUMINUM CARBON NITRIDE-AMORPHOUS CARBON NANOCOMPOSITE

FIELD OF THE INVENTION

The present invention relates to a nanocomposite, and more particularly, to a nanocomposite composing of titanium aluminum carbon nitride and amorphous carbon.

BACKGROUND OF THE INVENTION

In a micro view, material deformation is caused by dislocation glide, but it is not easy for ceramic material to have dislocation glide. When force is exerted on the ceramic material, the ceramic material is not easy to have dislocation glide, thus resulting in the phenomenon of stress concentration, so that cracks are very likely to be formed, wherein the brittle destruction appears. In order to overcome the shortcoming regarding the brittleness of ceramic material, nano-technologies developed recently have become one of the best choices.

Some studies indicate that: when the dimension of single material grain is decreased to the degree of nanometer, the material deformation can approach the degree of super-plasticity by room temperature creep. If the composite material is made by combining two or more phases of material, appropriate material types and the ratio thereof have to be selected, so as to increase the degree of plastic deformation via the gliding between the grains. The studies further indicate that: the adhesiveness of a nanocomposite composed of titanium carbide and amorphous carbon is superior to that of one single titanium carbide coating and that of one single amorphous carbon coating.

The nitrides and carbides of transition metals can be mutually dissolved to form carbon nitrides, and the properties of the carbon nitrides are varied in accordance with the value of $[C]/[C]+[N]$. Titanium carbon nitride (TiCN) has better wear resistance and toughness than titanium nitride, and titanium aluminum nitride (TiAlN) has better anti-oxidation and thermal hardness than titanium nitride. Both titanium carbon nitride and titanium aluminum nitride have the same rock salt structure as titanium nitride, wherein titanium carbon nitride is formed by substituting part of nitrogen atoms with carbon atoms, and titanium aluminum nitride is formed by substituting part of titanium atoms with aluminum atoms. The hardness and shear modulus of the rock salt structure material are related to the number of the valence electrons (i.e. valence electron concentration value; VEC value) of a cell unit in bonding. The VEC value of titanium nitride is 9, and the VEC value of titanium carbide is 8, and the VEC value of aluminum nitride with rock salt structure is 8. According to the experiment results and theoretical calculation, the previous studies indicate that: for a material having a VEC value between 8 and 9, the hardness and shear modulus thereof are increased; it can be thus inferred that the hardness and shear modulus of titanium aluminum carbon nitride (TiAlCN) are larger than that of titanium carbide; that of titanium nitride; and that of aluminum nitride, wherein the VHC value of titanium aluminum carbon nitride can be adjusted by changing the proportion of elements in titanium aluminum carbon nitride.

A nanocomposite can be a material of super hardness or of super toughness. For example, titanium nitride nanometer grains are separated via amorphous silicon nitride grain boundary of several nanometers in width. Since the size of nanometer grain is small, dislocations hardly exist in the internal thereof, and the gliding between the grains is further confined by the interaction force between the grains and the grain boundaries, the studies indicate that the hardness of titanium nitride nanocomposite can be equivalent to that of diamond.

Besides, in the actual application of hard coating, hardness is not the sole consideration. Generally speaking, the higher the hardness is, the lower the toughness is (such as diamond). If the material of super hardness falls off while in use, the substrate will suffer more sever damage. Although the material using amorphous carbon as matrix has worse overall hardness than the material of super hardness, yet with the properties of low friction coefficient of amorphous carbon and superior compatibility between amorphous carbon and grains, some studies have indicated that a composite composed of titanium carbide nanometer grains and an amorphous carbon matrix can increase the ductility and improve the adhesiveness of a coating. Therefore, it is expected that the ductility can be increased greatly by adding amorphous carbon into the coating of titanium aluminum carbon nitride as a matrix of nanometer grams.

On the basis of the aforementioned thought, the coating strength of a composite of titanium aluminum carbon nitride-amorphous carbon can be provided by titanium aluminum carbon nitride nanometer grains, and the great deformation of titanium aluminum carbon nitride-amorphous carbon can be provided by the gliding between the grains. Therefore, a superior toughness ceramic coating having superior strength and ductility can be developed, so that the ceramic coating can be used in making steel tools used under the cutting environment of high temperature and high speed, thereby enhancing the performance of tools and elongating the operation life thereof.

In view of the conventional materials having the drawbacks of easily occurring brittle destruction, the present invention provides a superior toughness and adhesive strength ceramic coating of titanium aluminum carbon nitride-amorphous carbon nanocomposite to overcome the drawback that the conventional ceramic material is brittle.

SUMMARY OF THE INVENTION

One major object of the present invention is to provide a nanocomposite composing titanium aluminum carbon nitride and amorphous carbon, and the nanocomposite comprises titanium aluminum carbon nitride grains with nanometer scale and an amorphous carbon matrix.

According to the above-mentioned conception, the structure of the titanium aluminum carbon nitride grains is double face-centered cubic packing structure.

According to the above-mentioned conception, part of the carbon elements exist in the titanium aluminum carbon nitride grains, and another part of the carbon elements constitute the amorphous matrix.

Another object of the present invention is to provide a method to coat a nanocomposite coating composing titanium aluminum carbon nitride and amorphous carbon on a substrate, the method comprising: depositing the substrate in a reaction chamber; injecting hydrogen carrier gas into the reaction chamber, and setting a plasma power and igniting plasma to clean and remove an oxide layer and adsorptive on the substrate; setting a temperature and injecting a reaction gas comprising nitrogen, methane, argon, titanium tetrachloride, and aluminum tichloride; and keeping an appropriate working pressure. The reaction gas is activated and thermal decomposed by plasma to form a nanocomposite coating of titanium aluminum carbon nitride-amorphous carbon on the surface of the substrate.

According to the aforementioned conception, the material of the substrate is selected from a group consisting of steel, silicon chip, glass, titanium alloy, and plastic.

According to the aforementioned conception, the hydrogen carrier gas can be replaced by nitrogen or argon.

According to the aforementioned conception, the plasma power is 100 watts.

According to the aforementioned conception, the temperature is set between 450° C. and 550° C.

According to the aforementioned conception, the working pressure is between 0.1 torr and 10 torrs.

According to the aforementioned conception, the thickness of nanocomposite coating of titanium aluminum carbon nitride-amorphous carbon is between 1 μm and 5 μm.

According to the aforementioned conception, the titanium aluminum carbon nitride is synthesized by titanium tetrachloride, aluminum trichloride, methane (or acetylene), and nitrogen (or ammonia).

According to the aforementioned conception, the amorphous carbon is synthesized by methane (or acetylene).

According to the aforementioned conception, the method for activating the reaction gas can use radio frequency plasma, direct current plasma, microwave, sputtering, or electric arc.

According to the aforementioned conception, the technique of the coating step can be replaced by a physical vapor deposition method, wherein a titanium target, an aluminum target, nitrogen, and methane are used as composition sources.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
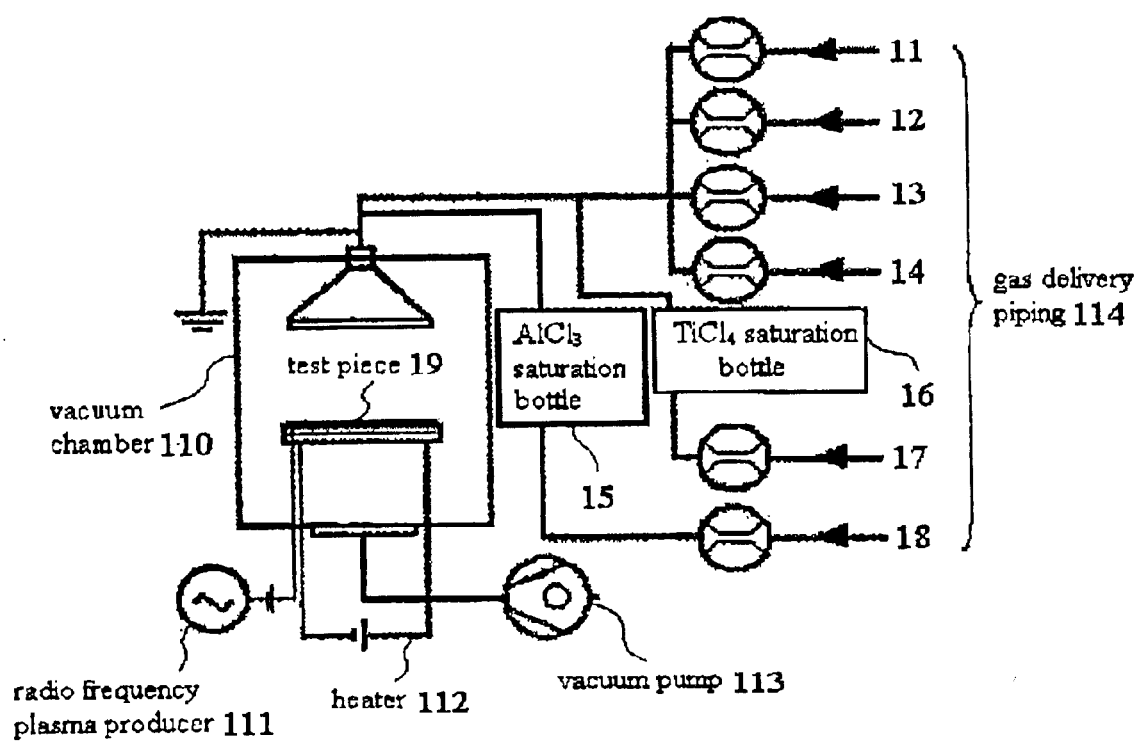
FIG. 1 illustrates a diagram showing an experimental apparatus of a radio frequency plasma chemical vapor deposition system of the present invention.

Referring to FIG. 1, FIG. 1 illustrates a diagram showing an experimental apparatus of a radio frequency plasma chemical vapor deposition system used in the present invention. In a preferred embodiment of the present invention, a vacuum chamber 110 is first vacuumed to form a vacuum environment, and a test piece 19 is deposited in the vacuum chamber 110 after being cleaned, and the temperature of the test piece 19 is adjusted to the temperature for coating by using a heater 112. Then, a gas delivery piping 114 is heated, and a gas flow controller (not shown) is set and hydrogen main gas 14 is injected into the vacuum chamber 110, wherein the gas delivery piping 114 introduces the gases comprising argon gas 11, methane gas 12, nitrogen gas 13, the hydrogen main gas 14, carrier gas 17, and carrier gas 18. At the same time, an aluminum trichloride saturation bottle 15 and a titanium tetrachloride saturation bottle 16 are heated to a predetermined temperature, and a radio frequency plasma producer 111 is actuated. The discharging power of the radio frequency plasma producer 111 is adjusted to discharge and control the plasma impedence. Sequentially, drying clean using hydrogen plasma is performed on the surface of the test piece 19 for one hour to remove the adsorptive and an oxide layer thereon. Thereafter, a reaction gas is injected into the vacuum chamber 110 and a coating step is performed to form a coating layer (not shown) on the test piece 19, wherein the reaction gas is injected from the argon gas 11, the methane gas 12, the nitrogen gas 13, the hydrogen main gas 14, the carrier gas 17, and the carrier gas 18. After completing the coating step, the reaction gas is stopped injecting and the radio frequency plasma producer 111 is turned off, and the test piece 19 is cooled down naturally to room temperature in the vacuum chamber 110 under the protection of the reduction atmosphere of hydrogen main gas 14. Then, the test piece 19 is taken out of the vacuum chamber 110 and tested.

The nitrogen gas 13 can be replaced by ammonia. The carrier gas 17 of titanium tetrachloride and the carrier gas 18 of aluminum trichloride can be replaced respectively by nitrogen and argon. The titanium source and the aluminum source can be replaced respectively by the organic metal composition containing titanium elements and the organic metal composition containing aluminum elements. The coating technique can be replaced by a physical vapor deposition method, wherein a titanium target, an aluminum target, nitrogen, and methane can be used as composition sources.

Furthermore, the method for producing plasma can be replaced by a microwave technique; a sputtering technique; an electric arc technique; or a direct current plasma technique. The material of nanometer grains can be TiSiN, TiCN, CN, diamond, and ZrN, etc., and the material of the amorphous matrix can be amorphous material, such as SiN and $Al_2O_3$.

The material of the test piece 19 is SKH51 high speed steel. The test piece 19 is thermally cured to the hardness of common use, and the test piece 19 is cleaned and dried within an acetone solution by using ultrasonic waves after polishing, and then the test piece 19 is put into the vacuum chamber 110. The material of the test piece 19 can be replaced by other kinds of steels, glass, silicon chip, or plastic, etc. The coating step is performed for two hours, and the thickness of the coating layer is about 1.5 μm.

In the embodiment, the test piece 19 is controlled at the temperature between 450° C. and 550° C.; the hydrogen main gas 14 is controlled at the flow rate about 50 sccm; the carrier gas 17 (or the flow speed of titanium tetrachloride) is controlled at the flow rate between 20 sccm and 40 sccm; the carrier gas 18 (or the flow speed of aluminum trichloride) is controlled at the flow rate between 60 sccm and 130 sccm; the methane gas 12 is controlled at the flow rate smaller than about 20 sccm; the nitrogen gas 13 is controlled at the flow rate smaller than about 40 sccm; the argon gas 11 is controlled at the flow rate of about 70 sccm; the radio frequency plasma producer 111 is controlled at the discharging power of about 100 watts; the working pressure is controlled at about 500 Pa; and the coating step is performed for two hours.

Identification of the Microstructure

Figure 2:
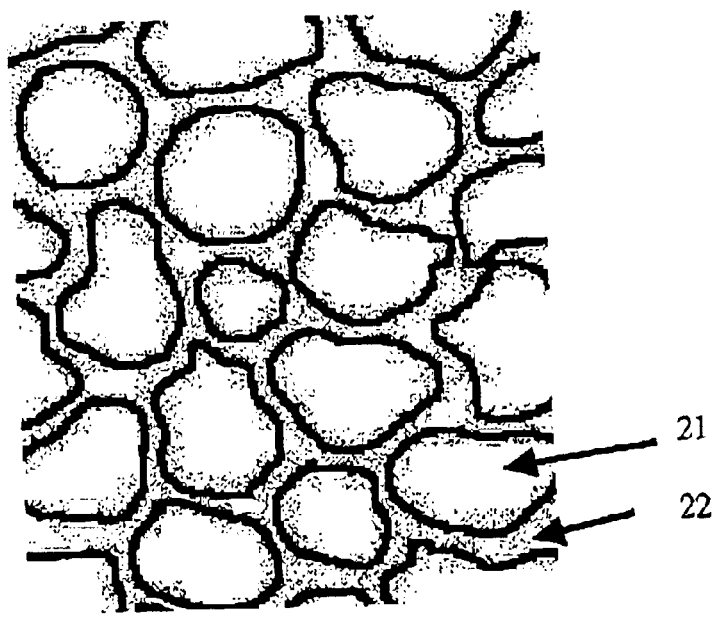
FIG. 2 illustrates a diagram showing a nanocomposite structure of the present invention.

Referring to FIG. 2, FIG. 2 illustrates a diagram showing a nanocomposite structure of the present invention. In FIG. 2, titanium aluminum carbon nitride grains 21 with nanometer scale are embedded in the amorphous carbon matrix 22.

Figure 3:
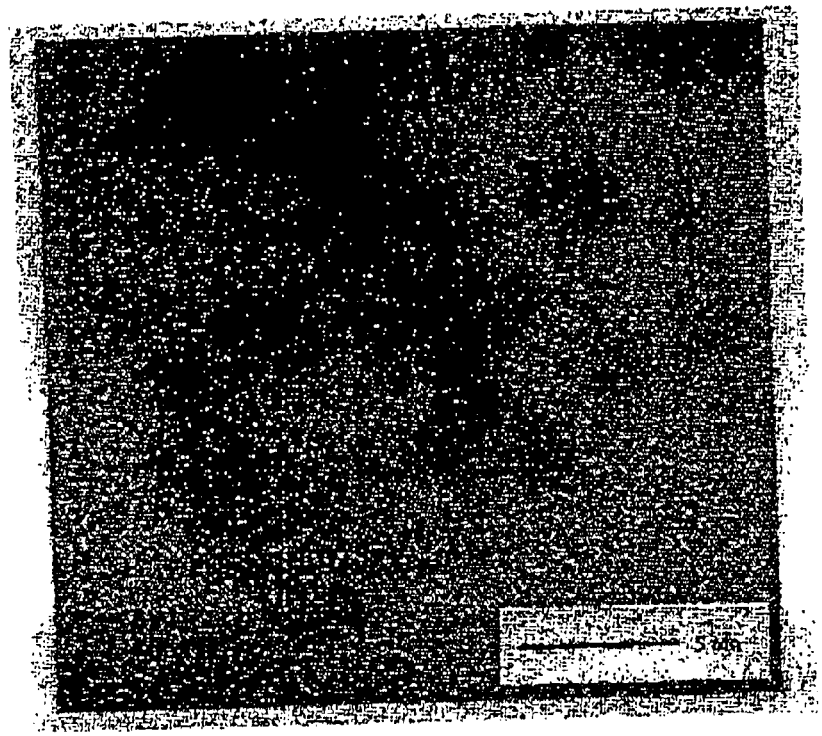
FIG. 3 illustrates a high-resolution transmission electron microscopy diagram observed in the present invention.

Referring to FIG. 3, FIG. 3 illustrates a high-resolution transmission electron microscopy diagram observed in the present invention. Regular lattice image is the titanium aluminum carbon nitride grains in the titanium nitride structure, and irregular area stands for the amorphous carbon phase. The structure shown in FIG. 3 is a preferred embodiment of the present invention.

Figure 4:
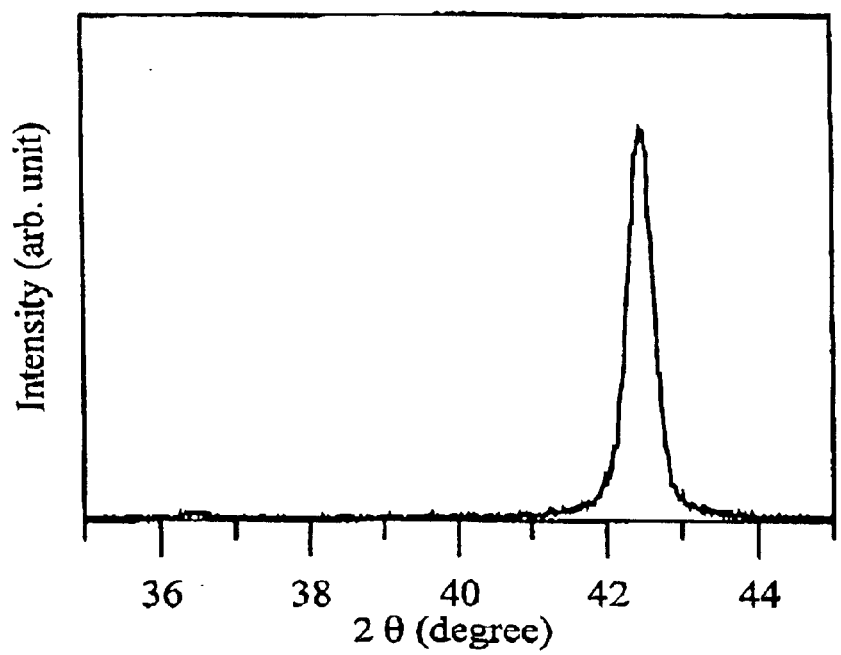
FIG. 4 illustrates an X-ray diffraction diagram of nano-grains of the present invention.

Referring to FIG. 4, FIG. 4 illustrates an X-ray diffraction diagram of nano-grains of the present invention. It is known that the grain structure shown in FIG. 4 is a double face-centered cubic packing structure of titanium nitride, from the result obtained by using an X-ray diffraction technique, and the comparison with JCPDS card.

Figure 5:
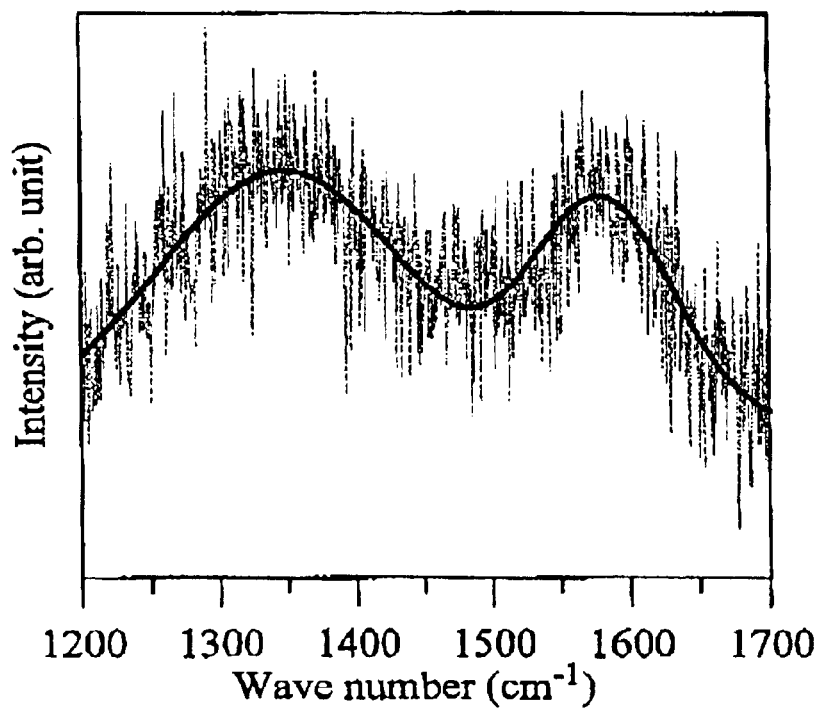
FIG. 5 illustrates a Raman scattering diagram of a nanocomposite coating of the present invention.

Referring to FIG. 5, FIG. 5 illustrates a Raman scattering diagram of a nanocomposite coating of the present invention. With the Raman scattering result shown in FIG. 5, it is known that amorphous carbon exists in the coating layer.

Therefore, according to the results shown in FIG. 3 to FIG. 5, the conception shown in FIG. 2 can be proved. Moreover, the grain size can be obtained by using Scherrer equation to calculate the integral of half height and width, and the calculated value of the grain size is 23.6 nm. The compositions of the coating layer can be measured by GDOS. In the coating layer, the average concentration ratio of titanium, aluminum, carbon, and nitrogen, from 0.1 $\mu$m to 0.6 $\mu$m depth from the surface of the coating layer, is 0.376:0.076:0.198:0.350.

Figure 6:
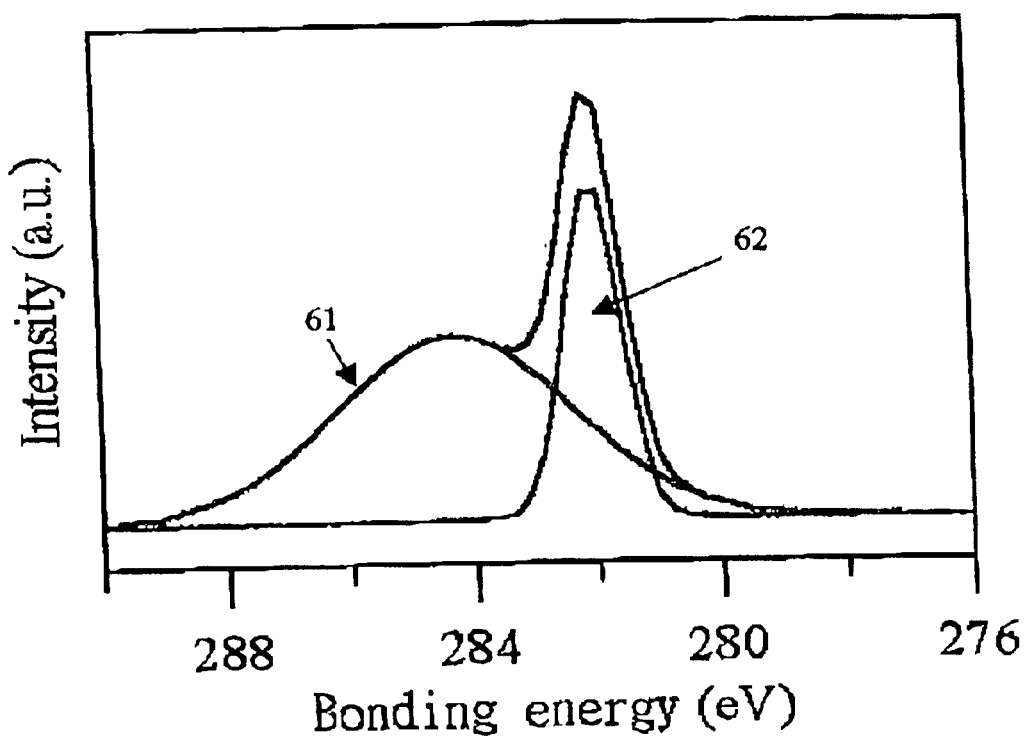
FIG. 6 illustrates an XPS energy landscape of the nanocomposite coating of the present invention.

Referring to FIG. 6, FIG. 6 illustrates an XPS energy landscape of the nanocomposite coating of the present invention. FIG. 6 shows that part of carbon elements in the coating layer is bonded in the form of carbide 62, which means that there are carbon atoms existing in titanium aluminum carbon nitride lattices. Another part of carbon elements in the coating layer is bonded in the form of amorphous carbon 61 and exists in the amorphous carbon matrix. The content ratio between the amorphous carbon 61 near 284.3 eV and the carbide 62 content near 282.0 eV can be calculated by using Gaussian curve analytic method, and the content ratio between the amorphous carbon 61 near 284.3 eV and the carbide 62 content near 282.0 eV is 0.69:0.31. From the calculated result, the ratio among titanium, aluminum, carbon, and nitrogen in nano-grains can be obtained, and the ratio among titanium, aluminum, carbon, and nitrogen in the nano-grains is 0.436:0.088:0.071:0.405. Besides, 13.7 at % amorphous carbon 61 exists outside the nano-grains.

According to the aforementioned discussion, the composition of the nanocomposite can be expressed as $(Ti_{0.83}Al_{0.17})(C_{0.15}N_{0.85})$/a-C, wherein the ratio of the metal (Ti, Al) to nonmetal elements (C, N) is 0.524:0.476, and the ratio slightly deviates from the measured ratio. It is reported from references that the aforementioned phenomenon is frequently seen in metal carbon nitride, since in the lattices, the locations of the metal elements are filled up and the locations of the nonmetal elements are vacant lowering the content of the nonmetal elements, when the content of the nonmetal is less than that of the metal.

Mechanical Property of the Coating Layer

The test methods include (a) using scrape path tester to test the adhesiveness of the coating layer, and (b) using nano-indentation tester to test the hardness and elastic coefficient of the coating layer.

(a) Adhesive Test of the Coating Layer

Figure 7:
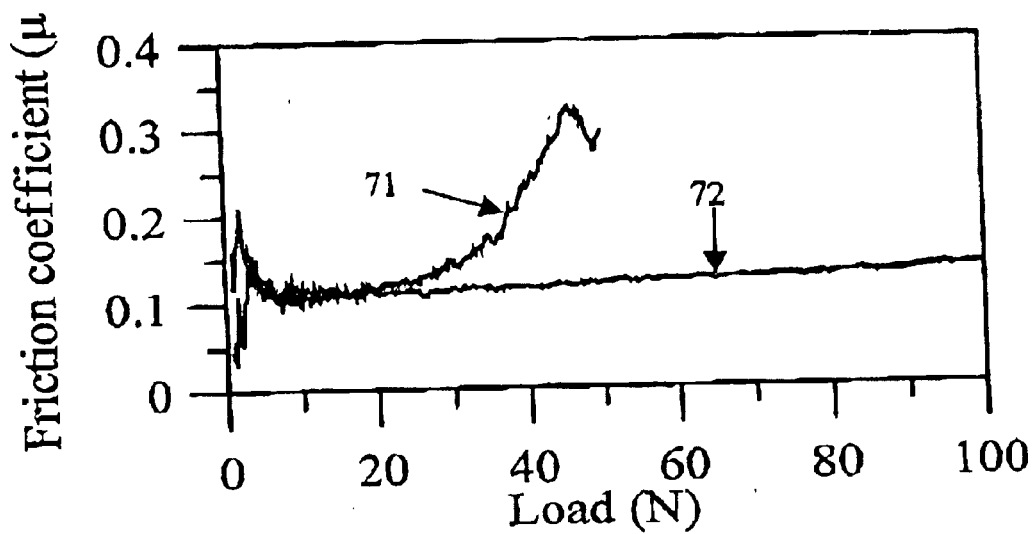
FIG. 7 illustrates a diagram showing the relationship between load and friction coefficient of an adhesive test of the present invention.

Referring to FIG. 7, FIG. 7 illustrates a diagram showing the relationship between normal load and friction coefficient of a nanocomposite coating layer of the present invention. The compositions of the coating layer are such as described above, and the measurement apparatus is a scrape path tester produced by Quad Group company, U.S.A., and the type of the scrape path tester is Mode Romulus III A. The testing conditions are: normal load: 0~100 N; the load increasing rate: 1N/sec; the dimension of the scrape path diamond head: 300 mm. The adhesiveness property of the coating layer can be known from the variation of friction coefficient. When the coating layer is peeled off, the diamond head will touch the substrate, and the friction coefficient will increase. Therefore, critical load is generally defined as the load corresponding to the abrupt change of the friction coefficient, and the critical load can be used as comparison to the adhesiveness of the coating layer. In FIG. 7, curve 72 represents the relationship between normal load and friction coefficient of the nanocomposite coating layer of the present invention, wherein the critical load of the nanocomposite coating layer is more than 100 N; curve 71 represents the relationship between normal load and friction coefficient of a titanium nitride coating layer, wherein the titanium nitride coating layer is formed by using the same process parameters as those for forming the nanocomposite coating layer. Comparing the curve 71 to the curve 72, it is known that the adhesiveness of the nanocomposite coating layer is enhanced greatly.

Figure 8:
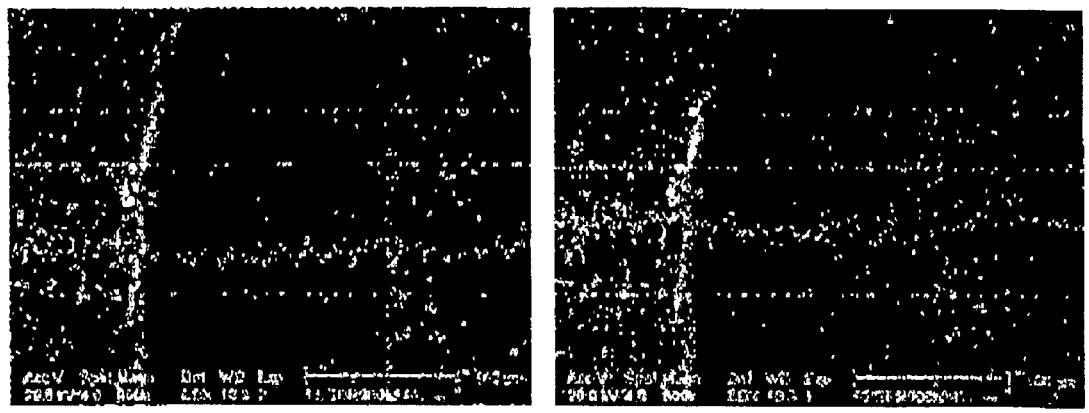
FIG. 8 illustrates a diagram showing scrape path and component analysis of the adhesiveness test of the present invention.

Referring to FIG. 8, FIG. 8 illustrates a scanning electron microscopy diagram showing the result of scrape path of the present invention. Under the load of 100 N, the coating layer has slightly conformal damage, and the conformal damage is the optimum damage form regarding adhesiveness. Furthermore, by using line scanning technique to check the element distribution on the scrape path, the element content thereof is not decreased along the scrape path, thus showing that the coating layer is not peeled off and the adhesiveness between the coating layer and the substrate is superior.

Figure 9:
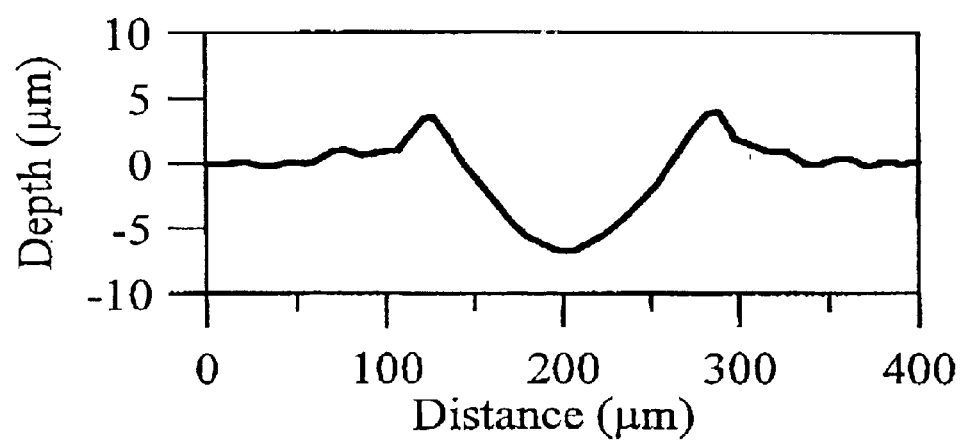
FIG. 9 illustrates a cross-sectional view of scrape path of the adhesiveness test of the present invention.

Referring to FIG. 9, FIG. 9 illustrates a cross-sectional view of scrape path measured by using α-step technique of the present invention. In FIG. 9, the depth of the scrape path is greater than 7 mm, and the thickness of the coating layer is only 1.3 mm, so that it is shown that the ductility of the coating layer is superior. Moreover, the deformation of the coating layer is much greater than the thickness of the coating layer, thus showing that the coating layer has superior plastic deformation ability.

(b) Hardness and Plastic Modulus Test of the Coating Layer

Figure 10:
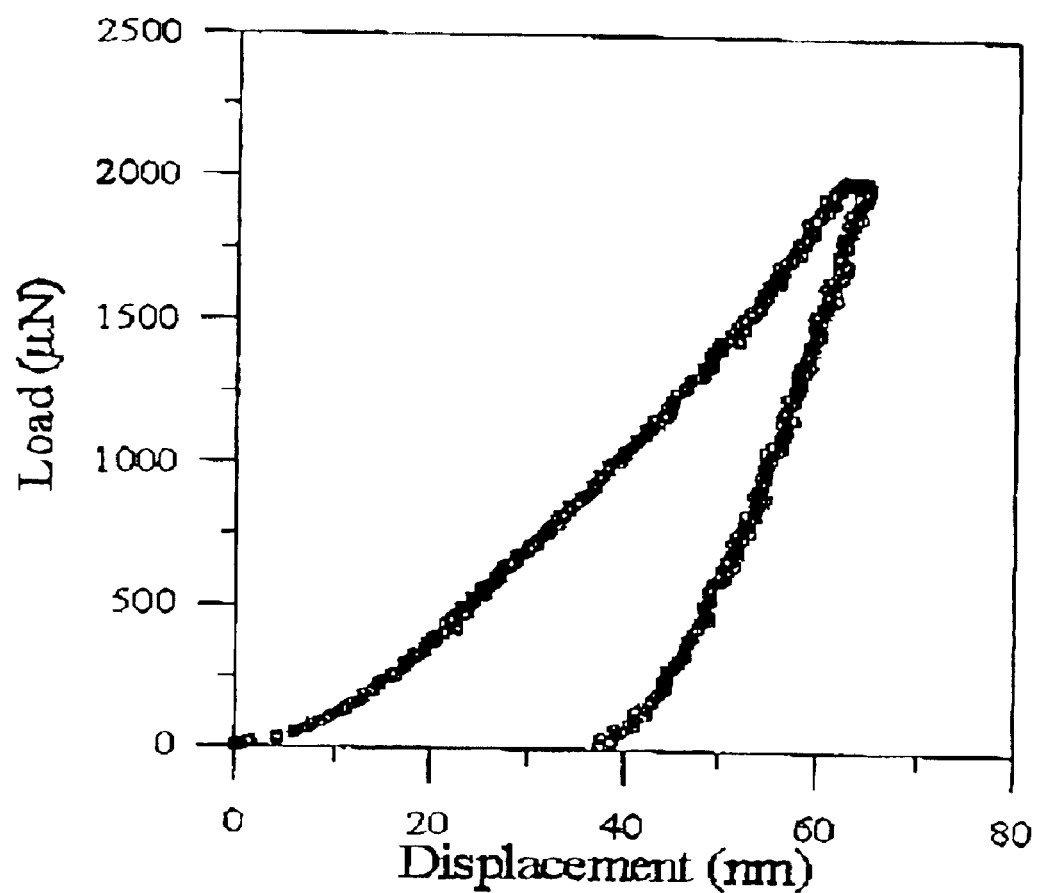
FIG. 10 illustrates a curve showing the relationship between load and displacement of a nano-indentation test of the present invention.

Referring to FIG. 10, FIG. 10 illustrates a curve showing the relationship between load and displacement of a nanocomposite coating layer of the present invention. In order to get the intrinsic hardness and elasticity modulus of the coating layer, the present invention uses a nano-indentation apparatus produced by the Hysitron company in U.S.A. and Digital Nanoscope II atomic force microscopy. The hardness of the coating layer can be calculated according to the deformation corresponding to the maximum load, and the elasticity modulus of the coating layer can be obtained from the slope of the unloading curve, and the plastic deformation of the coating layer is such as shown in FIG. 10. The compositions of the coating layer are just as described above, and the hardness thereof is 24.2 GPa, which is almost twice as much as that of the titanium nitride coating layer formed under the same process condition. The elasticity coefficient of the coating layer is 349.1 GPa, and the plastic deformation is 57.6%, thus representing that the coating layer has the superior properties of hardness and deformation.

To sum up, the present invention develops a new hard coating layer having superior toughness and superior adhesiveness with the conception of nanocomposite, meanwhile enhancing the strength and the ductility of the hard coating layer, thereby improving the drawback of the brittle ceramic material. Commonly, with the method using the PECVD technique to fabricate the $Ti_{1-x}Al_xN$ coating layer, when the x value is greater than 0.1, the coating layer cannot adhere to the substrate (i.e. it falls off completely). However, the $(Ti_{0.83}Al_{0.17})(C_{0.15}N_{0.85})$/a-C coating layer of the present invention can still adhere to the substrate even under a high load of 100 N. The present invention provides a simple process to greatly increase the adhesive strength of a coating layer, and to effectively improve the drawback of the coating layer of titanium aluminum nitride. Therefore, the present invention has industrial value, and can fully achieve the objects of the present invention.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A nanocomposite having titanium aluminum carbon nitride and amorphous carbon, comprising:
    a titanium aluminum carbon nitride grain of nanometer scale, wherein the composition of the titanium aluminum carbon nitride grain of nanometer scale is $Ti_{0.83}Al_{0.17}C_{0.15}N_{0.85}$; and
    an amorphous carbon matrix, wherein the titanium aluminum carbon nitride grain of nanometer scale is embedded into the amorphous carbon matrix, and the ratio of the metal (Ti, Al) to nonmetal elements (C, N) in the nanocomposite is 0.524: 0.476.

2. The nanocomposite according to claim 1, wherein the structure of the titanium aluminum carbon nitride grain of nanometer scale is a double face-centered cubic packing structure of titanium nitride.

3. The nanocomposite according to claim 1, wherein the nanocomposite comprises a plurality of carbon elements, and part of the carbon elements exists in the titanium aluminum carbon nitride grain of nanometer scale, and another part of the carbon elements constructs the amorphous carbon matrix.

* * * * *

UNITED STATES PATENT AND TRADEMARK OFFICE
CERTIFICATE OF CORRECTION

PATENT NO. : 6,821,919 B2
DATED : November 23, 2004
INVENTOR(S) : Ming-Hsiung Hon et al.

It is certified that error appears in the above-identified patent and that said Letters Patent is hereby corrected as shown below:

<u>Title page,</u>
Item [75], Inventors (namely the 2nd inventor), should read -- San Chung City --.

Signed and Sealed this

Sixteenth Day of August, 2005

JON W. DUDAS
*Director of the United States Patent and Trademark Office*